United States Patent [19]

Tsunekawa et al.

[11] 4,015,149
[45] Mar. 29, 1977

[54] TEMPERATURE COMPENSATING DEVICE FOR DEVICES HAVING SEMICONDUCTORS

[75] Inventors: Tokuichi Tsunekawa, Yokohama; Masanori Uchidoi; Tetsuya Taguchi, both of Kawasaki; Yoshiyuki Takishima, Machida; Tadashi Ito, Yokohama; Hiroshi Aizawa, Machida, all of Japan

[73] Assignee: Canon Kabushiki Kaisha, Tokyo, Japan

[22] Filed: June 3, 1975

[21] Appl. No.: 583,445

[30] Foreign Application Priority Data

June 6, 1974 Japan .............................. 49-64384

[52] U.S. Cl. .............................. 307/310; 307/229; 330/23; 307/311
[51] Int. Cl.² .................... H01V 3/00; H03F 1/32
[58] Field of Search ................. 307/310, 229, 308; 330/23

[56] References Cited

UNITED STATES PATENTS

| | | | |
|---|---|---|---|
| 3,703,651 | 11/1972 | Blowers | 307/310 |
| 3,705,316 | 12/1972 | Burrous et al. | 307/310 |
| 3,833,859 | 9/1974 | Carlson | 307/310 |

Primary Examiner—Stanley D. Miller, Jr.
Assistant Examiner—B. P. Davis
Attorney, Agent, or Firm—Toren, McGeady and Stanger

[57] ABSTRACT

A temperature compensating device for devices comprising semiconductors. The temperature compensating device comprises a temperature compensating circuit, such as a circuit including a diode, and a current control circuit which adjusts the quantity of the electric current flowing through the temperature compensating circuit. The temperature characteristic of the temperature compensating circuit is mutually compensatory with that of the output of the device comprising semiconductors. When the temperature characteristic of the output of said temperature compensating circuit differs from that of the output of such semiconductor device, the current control circuit causes a current which corresponds to the difference between the temperature coefficient of the compensating circuit and that of the semiconductor device to flow through the temperature compensating circuit, so that satisfactory temperature compensation can be accomplished.

6 Claims, 4 Drawing Figures

TEMPERATURE COMPENSATING DEVICE FOR DEVICES HAVING SEMICONDUCTORS

BACKGROUND OF THE INVENTION

The present invention relates to a temperature compensating device and more particularly to an improved temperature compensating device which is suitable for application to devices having semiconductors.

Generally, in devices having semiconductors such as transistors, thyristors, etc., the various characteristics of these semiconductors vary with temperature. Such variation in turn makes the performance characteristic of such devices unstable. In view of such, these have been disclosed some temperature compensating devices for stable performance of such devices. For example, U.S. Pat. No. 2,951,208, describes a device wherein there is provided a temperature compensating semiconductor circuit the voltage dropping rate of which varies with temperature, and the terminal voltage of the semiconductor circuit is used for changing the bias voltage of a semiconductor containing device in accordance with temperature variation to ensure the stable operation of the semiconductor containing device against such variation in temperature. However, it is a prerequisite to such a device that the temperature characteristic of the temperature compensating semiconductor circuit and that of the devices having semiconductors must be identical with each other. Usually, however, the characteristics of such temperature compensating semiconductor circuits and such semiconductor-containing or semiconductor-operated devices individually varies. Accordingly, satisfactory effect of temperature compensation can not be always attainable with such compensating devices. In order to attain satisfactory effect of compensation, the temperature compensating semiconductor circuit and the semiconductor apparatus must be selected to be of the same temperature characteristic. Then, such selection causes increase in the cost of such devices.

SUMMARY OF THE INVENTION

It is an object of this invention to provide a temperature compensating device which eliminates the above stated shortcoming of the conventional device and which gives satisfactory temperature compensating effect even where the temperature characteristic of a temperature compensating circuit differs from the temperature characteristic of a semiconductor device which is to be temperature compensated.

Another object of the invention is to provide a temperature compensating device, wherein there if provided the first semiconductor circuit having terminal voltage which varies with the variation of temperature; a voltage which corresponds to the terminal voltage of the first semiconductor circuit is impressed upon a bias source of a semiconductor device to compensate the variation of the temperature characteristic of the semiconductor device and, with the device being provided with means for making variable the current flowing through the first semiconductor circuit, a current which corresponds to the difference in temperature characteristic between the first semiconductor and the semiconductor device is caused by said variating means to flow through the first semiconductor circuit to compensate the variation in the temperature characteristic of the semiconductor device.

DESCRIPTION OF THE PREFERRED EMBODIMENTS

Figure 1:
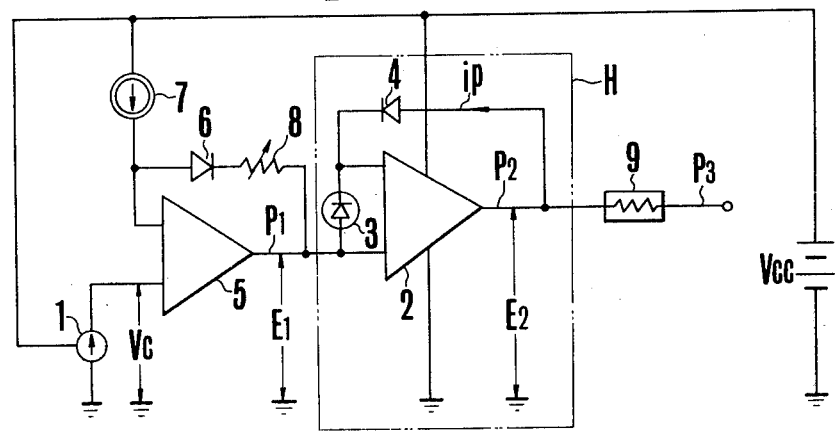
FIG. 1 is a circuit diagram illustrating an embodiment of the temperature compensating device of this invention as applied to a light measuring circuit which is provided with a diode for logarithmic compression.
Figure 2:
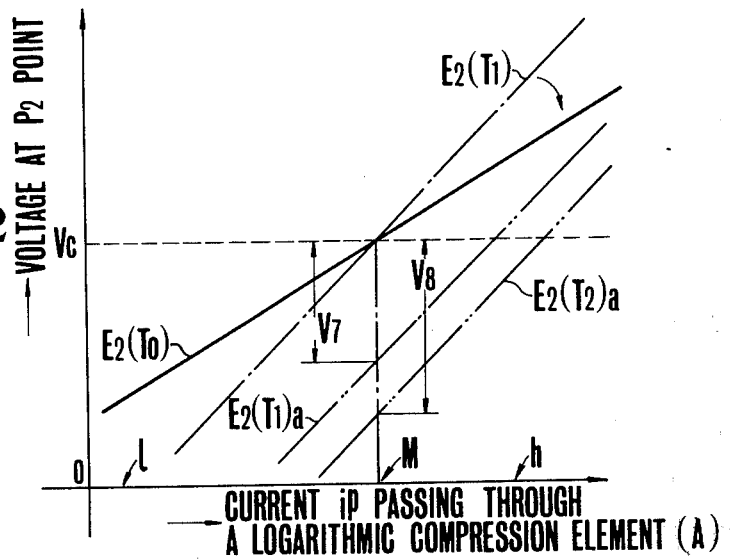
FIG. 2 is a graph illustrating the performance characteristic of the device of FIG. 1.

The details of the invented temperature compensating device for devices having semiconductors will become apparent from the following description, taken in connection with the accompanying drawings, in which:

FIG. 1 is a circuit diagram illustrating an embodiment of the temperature compensating device of this invention as applied to a light measuring circuit which is provided with diodes for logarithmic suppression; FIG. 2 is a graph illustrating the output voltage characteristic of each part of the device illustrated in FIG. 1. In the drawing, the reference numeral 1 represents a constant voltage source for level setting. The input end of the voltage source 1 is connected to a power source Vcc while its output end is connected to one of the input ends of an operational amplifier 5. The reference numeral 2 represents a light measuring operational amplifier. One of the input end of the operational amplifier 2 is connected to the operational amplifier 5 for impressing a bias voltage from the amplifier 5. The reference numeral 3 represents a light receiving element, such as a phototransistor, which receives the light of a photographing object; 4 represents a diode which is connected between the input and output ends of the operational amplifier 2 for logarithmically supressing a long current; 6 represents a temperature compensating diode employed as the first semiconductor element; and 7 represents a constant current source which comprises, for example, transistors connected by a emitter-follower type connection and the output current of which is arranged to be variable. The constant current source 7 supplies a current which corresponds to the difference between the temperature characteristic of the temperature compensating diode 6 and that of a light measuring circuit H, which is composed of the elements 2 through 4 and which thus represents here "the device having semiconductors." Reference numeral 8 represents a resistor which makes the current flowing through the diode 6 variable; and 9 represents a resistance made of a cupper wire or the like which possesses a positive temperature characteristic.

The above stated parts 1, 5, 6, 7 and 8 constitute a temperature compensating device. For the sake of description, let us assume that the value of the output voltage source 1 is Vc, the value of the biasing output voltage of the operational amplifier 5 is $E_1$ and the output voltage value of the operational amplifier 2 is $E_2$.

The above stated circuit arrangement operates as follows: When the incidence of reflected light from an object being photographed (not illustrated) takes place upon the light receiving element 3, the element produces a photoelectric current which corresponds to the incident illuminance and the photo current flows through the amplifier 2. Since the photo current is logarithmically suppressed by the diode 4, a voltage $E_2$ which is logarithmically suppressed in relation to the incident illuminance is produced at the output end $P_2$ of the amplifier 2. Assuming that the ambient temperature of the device is $T_0$, the output voltage $E_2$ varies as approximately represented by a straight line $E_2(T_0)$ in FIG. 2 relatively to the incident illuminance (in FIG. 2, this is expressed by $ip$). When the ambient temperature increase from $T_0$ to $T_1$, the voltage at the output end $P_2$ of the amplifier 2 varies from $E_2(T_0)$ to $E_2(T_1)$. These values of voltage can be expressed by the following formulas:

Assuming that the current flowing through the constant current source 7 is $i_c$, the reverse saturation current of the temperature compensating diode 6 is $i_{oc}(T_0)$, the current flowing through the diode 4 is $i_p$, the reverse saturation current of the diode 4 is $i_{op}(T_0)$, Boltzmann constant is $k$, the elementary charge is $q$, absolute temperature is T and the resistance value of the variable resistor 8 is R, the voltage $E_1(T_0)$ of the output end $P_1$ of the amplifier 5 at the temperature $T_0$ is expressed by $$E_1(T_o) = V_c - \left( \frac{k \cdot T_o}{q} \ln \left( \frac{i_c}{i_{oc}(T_o)} + 1 \right) + i_c \cdot R \right) \quad (1)$$

Accordingly, the voltage $E_2(T_0)$ of the output end $P_2$ of the amplifier 2 at the ambient temperature $T_0$ can be expressed by $$E_2(T_o) = E_1(T_o) + \frac{k \cdot T_o}{q} \ln \left( \frac{i_p}{i_{op}(T_o)} + 1 \right) \quad (2)$$

When the ambient temperature changes from $T_0$ to $T_1$, the voltage $E_2(T_1)$ of the output end $P_2$ of the amplifier 2 is expressed by;

$$E_2(T_1) = E_1(T_1) + \frac{k \cdot T_1}{q} \ln \left( \frac{i_p}{i_{op}(T_1)} + 1 \right) \quad (3)$$

Therefore, when the temperature $T_0$ increases to $T_1$, the output voltage $\Delta E_2(T_1 - T_0)$ at the end $P_2$ can be expressed by;

$$\Delta E_2(T_1 - T_0) = E_2(T_1) - E_2(T_0) \quad (4)$$

then, assuming that $$\left. \begin{array}{l} i_c \gg i_{oc}(T_o) \\ i_p \gg i_{op}(T_o) \end{array} \right\}$$

and that the photo electric current of the light receiving element 3 at a point M near the middle of the light measuring range (see FIG. 2) in $i_{pm}$, the output voltage at the end $P_2$ increases as much as:

$$\Delta E_2(T_1 - T_o) = \frac{k \cdot T_o}{q} \ln \left( \frac{i_c}{i_{oc}(T_o)} \right) - \frac{k \cdot T_1}{q} \ln \left( \frac{i_c}{i_{oc}(T_1)} \right)$$

$$+ \frac{k \cdot T_1}{q} \ln \left( \frac{i_{pM}}{i_{op}(T_1)} \right) - \frac{k \cdot T_1}{q} \ln \left( \frac{i_{pM}}{i_{op}(T_o)} \right) \quad (5)$$

Figure 3:
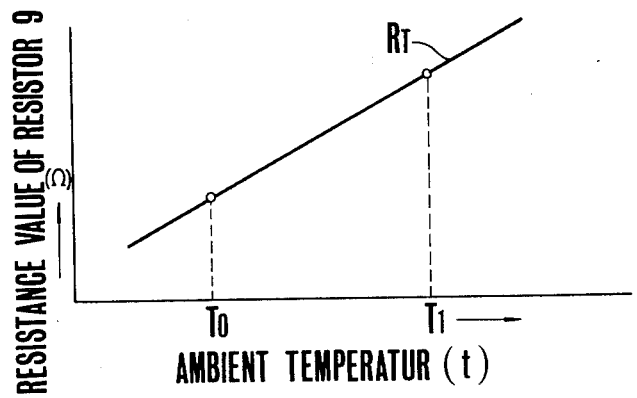
FIG. 3 is a graph illustrating the resistance characteristic of a resistor 9, which is used for temperature compensation.

With the temperature compensating device not provided, there is produced an error voltage $V_7(V)$ at the point M when the ambient temperature is $T_1$ and an error voltage $V_8(V)$ when the ambient temperature is $T_2$. In accordance with this invention, however, the output current $i_c$ of the constant current source 7 is $$i_c = \exp \left\{ \ln i_{pM} + \frac{T_o}{T_1 - T_o} \ln \frac{i_{op}(T_o)}{i_{oc}(T_o)} + \frac{T_1}{T_1 - T_o} \ln \frac{i_{oc}(T_1)}{i_{op}(T_1)} \right\} \quad (6)$$

namely the output current $i_c$ is set to be a current corresponding to the difference between the temperature characteristic of the light measuring circuit H (or "the device having semiconductors") and that of the temperature compensating diode 6. Therefore, the value of the variation $\Delta E_2(T_1 - T_0)$ of the output voltage $E_2$ resulting from the temperature increase becomes zero ($\Delta E_2(T_1 - T_0) = 0$). Thus, despite of temperature variation, the output voltage at the point $P_2$ is kept constant. Furthermore, while the light measuring circuit H is temperature compensated at the point M near the middle of the light measuring range by virtue of the constant current source 7, the characteristic of the output voltage at the point $P_2$ does not coincide with $E_2(T_0)$ shown in FIG. 2 and, as indicated by a straight line $E_2(T_1)$, it becomes higher than the output voltage at the point $P_2$ at temperature $T_0$ in the high brightness region $h$ (FIG. 2) while, in the lower brightness region $l$ (FIG. 2), it becomes lower than the output voltage of the point $P_2$ at temperature $T_0$. On the other hand, however, the resistance value of the resistor 9 which possesses a positive temperature coefficient varies with temperature as indicated by $R_T$ in FIG. 3. After all, therefore, the current which flows between the output ends $P_2$ and $P_3$, i.e. the current flowing through the resistor 9 which possesses a positive temperature coefficient is kept constant throughout the whole light measuring range irrespective of temperature variation. With this current arrangement applied to light measuring computing operation, therefore, an exposure control system which is totally unaffected by temperature variation can be optained.

Figure 4:
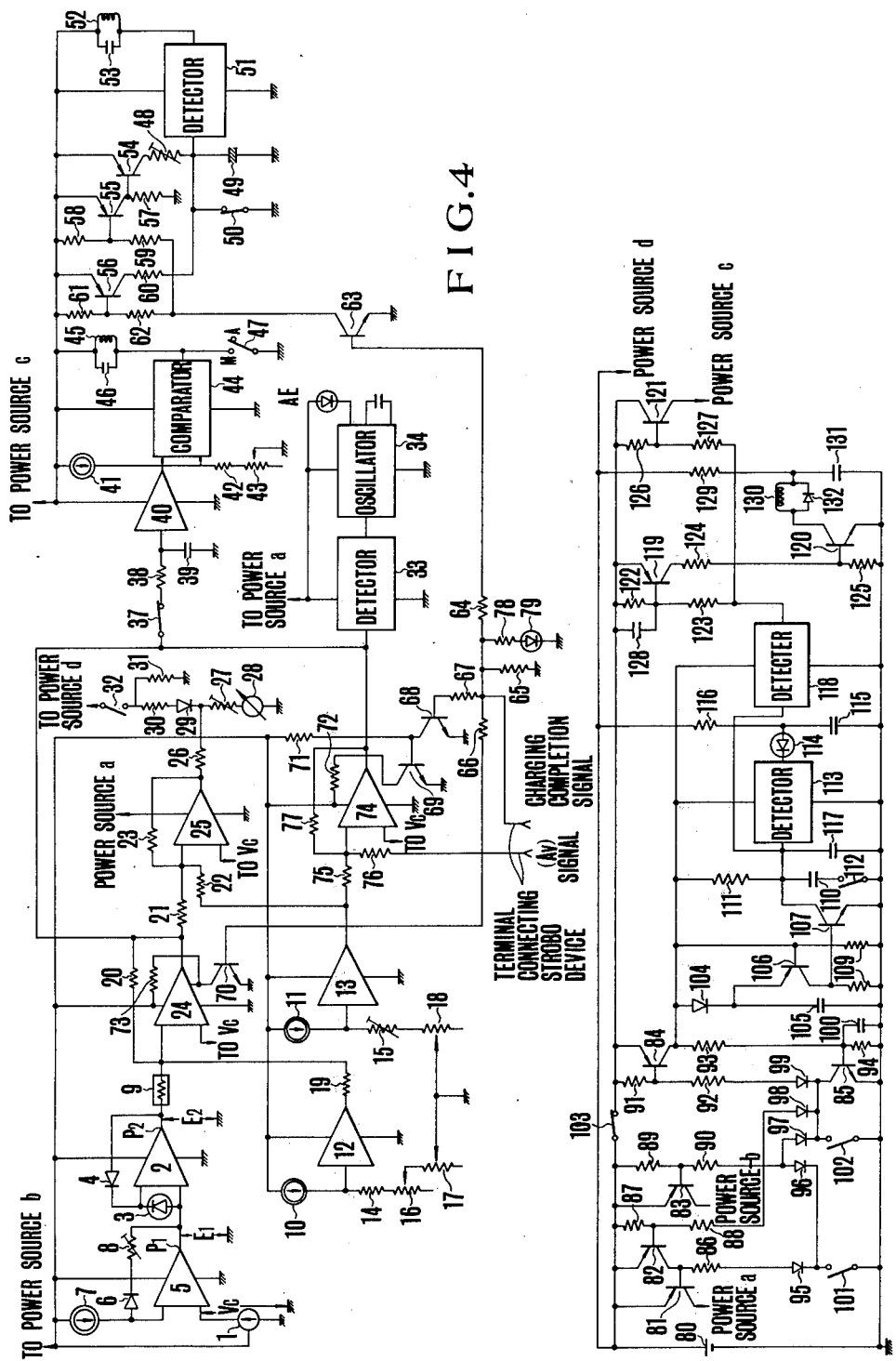
FIG. 4 is a circuit diagram of the temperature compensating device of this invention as applied to an exposure control device of a TTL single-lens reflex camera.

FIG. 4 is a circuit diagram representing an exposure control system of a camera to which the temperatu e compensating device of this invention is applied.

In FIG. 4, the same elements as those in FIG. 1 are indicated by the same reference symbols. The reference numerals 14 and 15 indicate resistors for voltage adjustment; 16 indicates a variable resistance which inserts the difference ($S_v - T_v$) between the film sensitivity $S_v$ and the shutter time $T_v$; 17 indicates a variable resistance which inserts aperture correcting (AVC) information; 18 indicates another variable resistance which inserts the F number (AVC) of the photographic lens aperture; 19 through 23 indicate resistors for information computing operation; 24 and 25 indicate operational amplifiers for information computing operation; and 26 through 28 represent an indicator circuit which indicates the value of exposure, 26 and 27 representing resistors and 28 an indicator or a meter. The reference numerals 29 through 31 represent a power source voltage check circuit, 29 indicating a diode for electrically separating the indicator circuit from the power source voltage check circuit, 30 indicating a resistor for setting the level of the power source voltage check circuit and 31 a resistor for current setting to provide a current equal to, for example, the current of an exposure control circuit which will be explained hereinafter; 32 indicates a switch for checking the power source voltage; 33 through 36 represent a low brightness alarm circuit, 33 indicating a detector with its input end connected to the output ends of operational amplifiers 24 and 74, 34 indicating an oscillator, 35 a capacitor and 36 a light emitting diode for low brightness alarm. As mentioned in the foregoing, F number stop information is supplied to the detector 33. When the stop information from the amplifier 24 becomes less than the F number of the photographic lens aperture, a pulse is produced from the output end of the detector. By this, the oscillator 34 is caused to oscillate and the light emitting diode 36 is flashed to indicate that the brightness of the photographing object is too low. The reference numeral 37 indicates a memory switch which operates with the ascent of a mirror (not illustrated); 38 indicates a resistor; 39 a capacitor for memorizing the brightness information on the photographing object; 40 an operational amplifier of high input impedance; 41 a constant current source; 42 an adjustment resistance; and 43 a variable resistance for setting the stop information, the resistance 43 is arranged to be charged with the motion of a film winding lever and its resistance value varies with the rotation of a governor which starts as the shutter release button is depressed. The reference numeral 44 indicates a comparator which compares the stop information memorized by the capacitor 39 with the stop information of the resistance 43 and which generates and produces a pulse from its output end when the former stop information coincides with the latter stop information; 45 indicates a magnet which drives a stop control mechanism (not illustrated) and which is brought into a nonexcited state by the output pulse of the above stated comparator. The reference numeral 46 indicates a capacitor which, in combination with the magnet 45, constitutes a resonance circuit to negate the residual magnetism of the magnet 45 for crisp operation of the magnet; 47 indicates an operation mode switch which is set in A position for an automatic stop-down mode and in M position for a manual stop-down mode. The reference numerals 48 through 53 represent a shutter time setting time constant circuit wherein 48 indicating a variable resistance for time setting; 49 a time constant capacitor; 50 a short circuit switch interlocked with a front diaphragm; 51 a detector; 52 a magnet for controlling the rear diaphragm of the shutter; and 53 a capacitor connected in parallel with the magnet 52. Numerals 54 through 63 represent an automatic shutter time switching circuit which automatically shifts the shutter time to a given length of time, such as 1/60 second for example, in response to a Strobo device charge completion signal when a Strobo device (no illustrated) is in use. In this circuit, 54 through 56 indicate transistors; 57 through 62 resistances; and 63 a transistor. The numerals 64 through 73 represent a circuit which switches the above stated information processing circuit to automatically set the stop value of the camera by using the stop down information from a Strobo device in response to a Strobo charge completion signal when the Strobo is in use, 64 through 67 indicating resistances; 68 through 70 transistors and 71 through 73 resistances. With Strobo charging completed, the transistors 55, 56, 63 68 and 70 are turned, the transistors 54 and 69 are turned off; and the capacitor 49 is charged through the transistor 56 and the resistance 60 with which a flash photographing time has been set at a given value. When the transistor 70 of the switching circuit is turned on, the operational amplifier 24 for information computing operation becomes inoperative. In place of the amplifier 25, with the transistor 69 then having been turned off, the information computing operational amplifier 74, which computes the absolute stop value information ($|Av|$) from the Strobo device and the information on the opening F number (AVO), becomes operative and then information operating resistances 75 through 77 accomplishes the information computing operation to produce information on F number through the output end of the amplifier 74. Then, using this F number information, the stop value of the camera can be set in the same manner as in daylight photographing which will be described hereinafter. The numerals 78 and 79 represent an indicating circuit for indicating the completion of charging the Strobo device, 78 indicating a resistance and 79 a light emitting diode for indicating the completion of the charging. The reference numerals 80 through 103 represent a power source driving circuit, wherein 80 indicates a cell, 81 through 85 transistors, 86 through 94 resistances, 95 through 99 diodes, 100 a noise preventing capacitor and 101 a switch which is turned on when the shutter release button is depressed in the first one step. With the switch 101 having been thus turned on, the transistors 81 and 83 are turned on and the power source supplies the power to the ends $a$ and $b$ to actuate the light measuring circuit and the exposure indicator circuit. When the shutter release button is further depressed in the second step, the switch 102 is turned on and, concurrently with this, the power supply to the $a$ end is shut off. The electric current flow to the exposure indicator circuit is shut off and the power supply self-holding circuit which comprises the transistors 84 and 85 and resistances 91 through 94 is actuated to hold the power supply $b$ there. With this condition having obtained, the power supply to the $b$ end is retained by the above stated self-holding circuit after the camera shutter release button is freed and the switches 101 and 102 are turned off. A switch 103 is a safety switch which is turned off by the commencement of the travel of the rear diaphragm of the camera shutter and is turned on by film winding. The reference numerals 104 through 109 represent an automatic reset circuit for a delay circuit which serves to delay the time until a selftimer and the first clamp operate. The reset circuit 109 comprises a diode 104, a capacitor 105, transistors 106 and 107 and resistances 108 and 109. The reference numerals 110 through 116 represent the above stated self-timer circuit wherein 110 indicates a capacitor for time delaying, 111 a resistance, 112 a switch for self-timer and 113 a detector which produces a signal to actuate a warning indicator 114 which gives a warning to the cameraman of the self-timer action a set length of time before the start of the shutter. The warning indicator also serves to indicate the shutter action for normal photographing. The reference numeral 115 indicates an electric charge storing capacitor disposed to ensure the operation of the self-time action warning indicator 114 and 116 a resistance. The numerals 117 and 118 represents a circuit for delaying the first clamp, 117 indicating a capacitor and 118 a detector. For normal daylight photographing, the detector 118 produces a signal after a set length of the delaying time. The numerals 119 through 132 represent a circuit for the first clamping action and power supply, 119 through 121 indicating transistors, 122 through 127 resistances, 128 a noise preventing capacitor, 129 a resistance which restricts the speed of charging a capacitor 131 which is employed as a power source for operating a magnet 130. The value of the resistance 129 is preset to give a sufficient speed at which the capacitor 131 can be adequately charged when the camera is operated at a high speed. The numeral 132 indicates a diode which is disposed to prevent a reverse pulse of the magnet 130. When the detector 118 produces a signal, the transistors 119 through 121 are turned on and the first clamp operates. Concurrently with this, the power supply to the c end begins and the automatic stop control circuit and the time control circuit begin to operate. Therefore, automatic exposure control is accomplished at the values based on the light measurement and information computing operation. The arrangement described in the foregoing will be further explained taking daylight photographing as an example. First, shutter dial (not illustrated) is turned to set a desired shutter time at the resistances 48 and 16. Aperture correcting information (AVC) is set at the resistance 17 and the opening F number (AVO) is set at the resistance 18. With such setting, the camera is directed toward the photographing object and the shutter release button (not illustrated) is depressed to close the switch 101. This causes the base current to flow the transistors 81 and 83 through the resistance 86, diode 95, resistance 90 and diode 96 to turn on the transistors 81 and 83. Then, voltage is supplied from the cell 80 to the $a$ and $b$ ends to bring the light measuring circuit and the exposure indicator circuit into operating conditions respectively. By this, the electric potential at the output end $P_2$ of the amplifier 2 of the light measuring circuit is made to be a value which corresponds to the brightness of the photographing object. Then, at the output end of the information computing operational amplifier 24, there is generated a voltage corresponding to the number of steps by which stopping down must be made from the full open position; the stopping down information is stored at the capacitor 39 through the switch 37. Futhermore, a voltage corresponding to the absolute stop value information is generated at the output end of the information computing operational amplifier 25 to cause the indicator 28 to indicate the absolute stop value. With shutter release button further depressed, the switch 102 is turned on and the transistor 82 is also turned on. By this, the transistor 81 is turned off to discontinue the voltage supply from the cell 80 to the $a$ end. The amplifier 25 becomes inoperative and the current to the exposure indicator circuit is shut off. At the same time, the above stated power supply self-holding circuit begins to operate to continue the voltage supply to the $b$ end. After a length of time determined by the time constant between the resistance value R of the resistance 111 and the capacity $c$ of the capacitor 117, a pulse is generated from the output of the detector 118. The pulse causes the cell 80 to impress voltage on the ends $c$ and $d$. Then the above stated stop control circuit and the time control circuit become operative. Concurrently, the transistor 120 is turned on and a pulse voltage is impressed on the first clamp magnet 130. The first clamp member, which has been locking the mirror preventing it from ascending, then unlocks to permit the ascent of the mirror. The switch 37 opens. The stopping down information stored at the capacitor is impressed on one input end of the comparator 44 and, at the same time, a governor which is not illustrated is operated and the insertion of the lens stop setting information into the resistance 43 begins. When the stop value set at the photographing lens by the governor becomes equal to the stopping down information stored at the capacitor, the comparator 44 produces a pulse to make the magnet 45 unexcited. The operation of the governor discontinues and the stop is set at a correct value. When the mirror further ascends to start the front diaphragm (not illustrated) and thus to start the exposure, the short circuit switch 50 opens in a linked relation to the operation of the magnet 45. The capacitor 49 is charged through the transistor 54 and the variable resistance 48 which is provided for setting the shutter time. When the terminal voltage of the capacitor 49 reaches a preset value, the detector 51 produces a pulse to make the magnet 52 unexcited and the rear diaphragm travels to complete the exposure. Upon completion of the exposure, te safety switch 103 is turned off and, at the same time, the self-holding circuit of the power source is cut off. the transistors 106 and 107 are turned on by the electric charge of the capacitor 105. The electric charge of the capacitor 110 of the self-timer and that of the capacitor 117 provided for delaying the first clamp are discharged. Thus, there obtains the original conditions.

In order to obtain a good temperature compensating effect with the conventionally known temperature compensating circuits, it is necessary to use elements of the same temperature characteristics by selecting such out of many elements. Such selection causes an extremely high cost of each element and thus results in an extremely high cost of the whole device. Whereas, in accordance with the present invention, commercially available ordinary elements of varied temperature characteristics can be employed in the temperature compensating circuit and also in a semiconductor device (a light measuring circuit in the case of the embodiment illustrated in FIG. 1.) With the invented temperature compensating device, therefore, the cost of each element can be reduced and eventually that of the device will be lowered. Furthermore, with an element of a positive temperature coefficient connected to the output side of a semiconductor device, the temperature compensating device of this invention can compensate variations in the temperature characteristic to a great extent.

What is claimed is:

1. In a temperature compensating device wherein a semiconductor circuit has a signal input terminal and a bias terminal and wherein a signal output terminal, a signal source is connected to the signal input terminal and a bias voltage is impressed on said bias terminal and wherein said circuit includes a first temperature responsive semiconductor diode for adjusting an input signal from said signal source to a varying degree of adjustment according to the variation of temperature, wherein said temperature compensating device also includes a temperature compensating circuit which comprises a second temperature responsive semiconductor diode which lowers voltage as temperature varies and an output terminal which is connected to the bias terminal of said semiconductor circuit in such a manner that the voltage reduction by said second temperature responsive diode serves to minimize the variation of the output signal from the signal output terminal of said semiconductor circuit due to temperature variation, an improvement comprising:

an electric current source for feeding said second temperature responsive semiconductor diode with an electric current $i_c$ which corresponds to the difference in operating characteristics between said first temperature responsive diode and said second diode and which is based on the following formula:

$$i_c = exp\left\{ \ln i_{pM} + \frac{T_o}{T_1-T_o} \ln \frac{i_{op}(T_o)}{i_{oc}(T_o)} + \frac{T_1}{T_1-T_o} \ln \frac{i_{oc}(T_1)}{i_{op}(T_1)} \right\}$$

wherein $i_{pM}$ : quantity of current corresponding to the mean value of the input signal from said signal source $T_o$ : ambient temperature of said semiconductor circuit $T_1$ : same as $T_o$ except that $T_1 > T_o$, and $i_{oc}(T_o)$ : the reverse saturation current of said second temperature responsive semiconductor diode at temperature $T_o$ $i_{op}(T_o)$ : the reverse saturation current of said first temperature responsive semiconductor diode at temperature $T_o$.

2. The temperature compensating device according to claim 1, wherein said signal source is a photovoltaic cell.

3. The temperature compensating device according to claim 2, wherein said temperature compensating device includes an element which has a positive temperature coefficient connected to the signal output terminal of said semiconductor circuit device for the purpose of stabilizing the operating characteristic of the semiconductor circuit device over a wide range.

4. The temperature compensating device according to claim 3, wherein said element having a positive temperature coefficient is composed of a resistor.

5. The temperature compensating device according to claim 4, wherein said resistor having a positive temperature coefficient is a copper winding.

6. The temperature compensating device according to claim 1, wherein in the case where $ioc(T) = iop(T)$ said electric current source supplies electric current $I_c = i_{pM}$ to said second temperature responsive semiconductor diode.

* * * * *